(12) United States Patent
Dawirs et al.

(10) Patent No.: US 9,008,260 B2
(45) Date of Patent: *Apr. 14, 2015

(54) NON-VOLATILE MEMORY COUNTER

(71) Applicant: Proton World International N.V., Zaventem (BE)

(72) Inventors: Michel Dawirs, Wezembeek-Oppem (BE); Jean-Louis Modave, Ottignies (BE)

(73) Assignee: Proton World International N.V., Zaventem (BE)

( * ) Notice: Subject to any disclaimer, the term of this patent is extended or adjusted under 35 U.S.C. 154(b) by 0 days.

This patent is subject to a terminal disclaimer.

(21) Appl. No.: 14/099,732

(22) Filed: Dec. 6, 2013

(65) Prior Publication Data

US 2014/0093026 A1    Apr. 3, 2014

Related U.S. Application Data

(62) Division of application No. 13/560,476, filed on Jul. 27, 2012, now Pat. No. 8,660,233.

(30) Foreign Application Priority Data

Jul. 29, 2011    (FR) ...................... 11 57006

(51) Int. Cl.
| | |
|---|---|
| H03K 21/00 | (2006.01) |
| G11C 16/34 | (2006.01) |
| H03K 21/40 | (2006.01) |

(52) U.S. Cl.
CPC .............. *H03K 21/00* (2013.01); *G11C 16/349* (2013.01); *H03K 21/403* (2013.01)

(58) Field of Classification Search
CPC ..... H03K 21/00; H03K 21/403; G11C 16/349
USPC ........ 327/339; 377/15, 16, 26, 33, 37, 44, 49; 365/236
See application file for complete search history.

(56) References Cited

U.S. PATENT DOCUMENTS

| | | | |
|---|---|---|---|
| 3,767,902 | A | 10/1973 | Estes et al. |
| 4,160,154 | A | 7/1979 | Jennings |
| 5,109,395 | A | 4/1992 | Tanaka |
| 6,496,437 | B2 | 12/2002 | Leung |
| 6,961,402 | B1 | 11/2005 | Younis |
| 2002/0075989 | A1 | 6/2002 | Joo |
| 2007/0147168 | A1 | 6/2007 | Pinto et al. |

FOREIGN PATENT DOCUMENTS

WO    WO 85/04297 A1    9/1985

OTHER PUBLICATIONS

French Search Report and Written Opinion dated Dec. 20, 2011 from corresponding French Application No. 11/57006.

*Primary Examiner* — Jung Kim
(74) *Attorney, Agent, or Firm* — Seed IP Law Group PLLC

(57) ABSTRACT

A counter in a non-volatile memory including at least two sub-counters, each counting with a different modulo, an increment of the counter being transferred on a single one of the sub-counters and the sub-counters being incremented sequentially.

15 Claims, 1 Drawing Sheet

NON-VOLATILE MEMORY COUNTER

CROSS REFERENCE TO RELATED APPLICATIONS

This application is a division of U.S. patent application Ser. No. 13/560,476, filed Jul. 27, 2012, which claims the priority benefit of French Patent Application No. 11/57006, filed Jul. 29, 2011, and which applications are hereby incorporated by reference to the maximum extent allowable by law.

BACKGROUND

1. Technical Field

Embodiments generally relate to electronic circuits, and more specifically to the forming of a counter of events or transactions in an electronic circuit non-volatile memory.

2. Discussion of the Related Art

Event counters having their value stored in a non-volatile memory are more and more frequent in electronic circuits. Such counters count and store in non-volatile fashion a number of events or transactions.

An example is the counting of a number of uses of a function or of an application. It may also be a time counter intended to count and to store the duration of use of an application of a medium, of a circuit, etc. It may also be a counter guaranteeing the uniqueness of the data in the case of a cryptographic function.

Counters formed in non-volatile memory, that is, having their counter bits directly formed of non-volatile memory cells, are here distinguished from memory areas storing the results of a calculation (or of a counter formed in volatile memory), for which the recording to the result is only performed when this result needs to be stored in a non-volatile memory. The embodiments described herein are directed to counters of the first category, that is, counters formed in non-volatile memory.

The counters targeted by the embodiments which will be described are counters incremented by a relatively low step with respect to the counter value, typically by an increment ranging between 1 and 8.

A problem encountered in counters of this type formed in non-volatile memory is linked to the limited lifetime of the storage cells in terms of number of write operations. Indeed, non-volatile memory cells of EEPROM or FLASH type have a wearing effect. Typically, an EEPROM cell withstands on the order of 500,000 write cycles.

To form a counter capable of counting a number of transactions greater than this endurance, more non-volatile memory cells than the theoretically required number have to be used. In particular, for each increment (assuming an increment by one unit), many of the bits or at least the least significant bit which changes value for each transaction have to be written. For example, a counter capable of counting up to 2 million is theoretically performed over three bytes (often plus one byte for a CRC calculation). In practice, four times as much room is requested, the counter being transferred towards four other memory bytes each time the theoretical maximum number of write cycles has been reached.

SUMMARY

An object of an embodiment is to overcome all or part of the disadvantages of non-volatile memory transaction counters.

Another object of an embodiment is to decrease the number of bits or of bytes necessary to implement such a counter.

To achieve all or part of these and other objects, an embodiment provides a counter in a non-volatile memory comprising at least two sub-counters, each counting with a different modulo, an increment of the counter being transferred on a single one of the sub-counters and the sub-counters being incremented sequentially.

According to an embodiment, the maximum number of increments of a sub-counter is selected according to the maximum number of write cycles capable of being performed on a non-volatile memory cell.

According to an embodiment, the counter comprises a function of selection of the sub-counter to be incremented.

According to an embodiment, the counter comprises a function of reconstruction of the counter result in read mode.

According to an embodiment, each sub-counter comprises at least one byte.

Another embodiment provides a method for reconstructing the number stored in such a counter, wherein the reconstruction function uses the Chinese remainder theorem.

Another embodiment provides an electronic circuit integrating such a counter.

The foregoing and other objects, features, and advantages will be discussed in detail in the following non-limiting description of specific embodiments in connection with the accompanying drawings.

DETAILED DESCRIPTION

Figure 1:
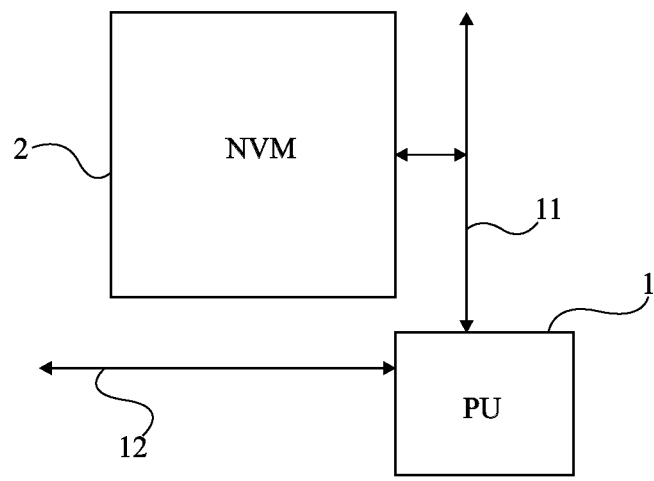
FIG. 1 schematically shows an electronic circuit equipped with a non-volatile memory.

The same elements have been designated with the same reference numerals in the different drawings. For clarity, only those steps and elements which are useful to the understanding of the described embodiments have been shown and will be discussed. In particular, the type of transactions counted by the counter has not been detailed, the described to embodiments being compatible with usual applications of a non-volatile memory transaction counter. Further, the forming of an electronic circuit equipped with a non-volatile memory has not been detailed either, the described embodiments being here again compatible with usual circuits.

FIG. 1 is a block diagram of an embodiment of an electronic circuit equipped with a counter. FIG. 1 is a very simplified and partial drawing. The electronic circuit comprises a processing unit (PU) 1 capable of communicating over various address and data buses 11 and 12 with various circuits of the electronic circuit. Among such circuits, a non-volatile memory 2 (NVM) stores data and contains at least one transaction counter. This counter is a counter directly formed in the memory, that is, for each increment or decrement of the counter, at least one non-volatile storage element bit is updated.

Preferably, the counter is a monotonic counter (increasing or decreasing) incremented (or decremented) by one unit for each operation.

Figure 2:
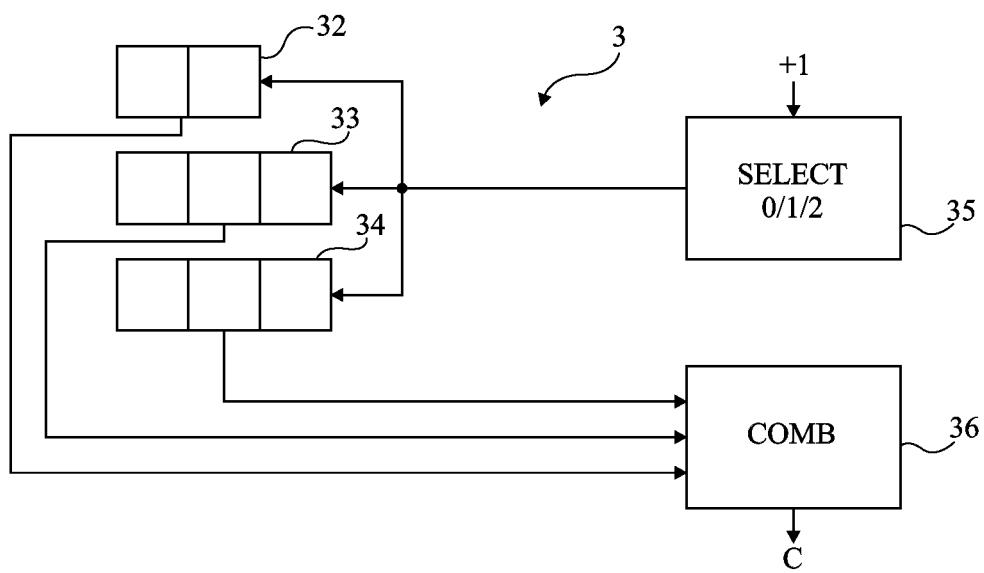
FIG. 2 schematically illustrates an embodiment of a transaction counter.

FIG. 2 illustrates a simplified embodiment of a counter formed in a non-volatile memory. According to this example, counter 3 is divided into three memory areas 32, 33, and 34 or sub-counters, respectively over two bits for area 32 and over three bits for areas 33 and 34. Sub-counter 32 performs a counting modulo 3. Sub-counter 33 performs a counting modulo 5 and sub-counter 34 performs a counting modulo 7.

For each incrementation of the number of transactions, starting from counter 3, one of counters 32, 33, or 34 to be incremented is selected. For this purpose, a function 35 of the electronic circuit, for example, the software executed by means of processing unit 1 (FIG. 1) or a dedicated logic circuit in a hardware implementation, selects one of the three counters (SELECT 0/1/2) to be incremented. This means that for each new transaction, a single one of the sub-counters is incremented. The counters are used sequentially. Accordingly, in this example, the maximum number of write cycles that a cell of the non-volatile memory can stand is multiplied by three.

When result C of the counter is desired to be read, the reconstruction requires a combination function 36 (COMB) taking into account the respective values of the three sub-counters 32, 33, and 34.

Table 1 hereafter illustrates the operation of the counter of FIG. 2. The first column shows number C of transactions counted by counter 3, second column SELECT identifies the concerned sub-counter by incrementing its value once the number of transactions has been incremented (value 0 is assigned to sub-counter 32, value 1 is assigned to sub-counter 33, and to value 2 is assigned to sub-counter 34). The three columns C32, C33, and C34 show the respective values taken by sub-counters 32, 33, and 34 by taking into account the fact that they respectively vary modulo 3, modulo 5, and modulo 7.

TABLE 1

| C | SELECT | C32 | C33 | C34 |
|---|---|---|---|---|
| 0 |  | 0 | 0 | 0 |
| 1 | 0 | 1 | 0 | 0 |
| 2 | 1 | 1 | 1 | 0 |
| 3 | 2 | 1 | 1 | 1 |
| 4 | 0 | 2 | 1 | 1 |
| 5 | 1 | 2 | 2 | 1 |
| 6 | 2 | 2 | 2 | 2 |
| 7 | 0 | 0 | 2 | 2 |
| 8 | 1 | 0 | 3 | 2 |
| 9 | 2 | 0 | 3 | 3 |
| 10 | 0 | 1 | 3 | 3 |
| 11 | 1 | 1 | 4 | 3 |
| 12 | 2 | 1 | 4 | 4 |
| 13 | 0 | 2 | 4 | 4 |
| 14 | 1 | 2 | 0 | 4 |
| 15 | 2 | 2 | 0 | 5 |
| 16 | 0 | 0 | 0 | 5 |
| 17 | 1 | 0 | 1 | 5 |
| 18 | 2 | 0 | 1 | 6 |
| 19 | 0 | 1 | 1 | 6 |
| 20 | 1 | 1 | 2 | 6 |
| 21 | 2 | 1 | 2 | 0 |
| 22 | 0 | 2 | 2 | 0 |
| 23 | 1 | 2 | 3 | 0 |
| 24 | 2 | 2 | 3 | 1 |
| 25 | 0 | 0 | 3 | 1 |
| 26 | 1 | 0 | 4 | 1 |
| 27 | 2 | 0 | 4 | 2 |
| 28 | 0 | 1 | 4 | 2 |
| 29 | 1 | 1 | 0 | 2 |
| 30 | 2 | 1 | 0 | 3 |
| 31 | 0 | 0 | 0 | 3 |
| 32 | 1 | 0 | 1 | 3 |
| 33 | 2 | 0 | 1 | 4 |
| 34 | 0 | 1 | 1 | 4 |
| 35 | 1 | 1 | 2 | 4 |
| 36 | 2 | 1 | 2 | 5 |
| 37 | 0 | 2 | 2 | 5 |
| 38 | 1 | 2 | 3 | 5 |
| 39 | 2 | 2 | 3 | 6 |
| 40 | 0 | 0 | 3 | 6 |
| 41 | 1 | 0 | 4 | 6 |
| 42 | 2 | 0 | 4 | 0 |
| 43 | 0 | 1 | 4 | 0 |
| 44 | 1 | 1 | 0 | 0 |
| 45 | 2 | 1 | 0 | 1 |
| 46 | 0 | 2 | 0 | 1 |
| 47 | 1 | 2 | 1 | 1 |
| 48 | 2 | 2 | 1 | 2 |
| 49 | 0 | 0 | 1 | 2 |
| 50 | 1 | 0 | 2 | 2 |
| 51 | 2 | 0 | 2 | 3 |
| 52 | 0 | 1 | 2 | 3 |
| 53 | 1 | 1 | 3 | 3 |
| 54 | 2 | 1 | 3 | 4 |
| 55 | 0 | 2 | 3 | 4 |
| 56 | 1 | 2 | 4 | 4 |
| 57 | 2 | 2 | 4 | 5 |
| 58 | 0 | 0 | 4 | 5 |
| 59 | 1 | 0 | 0 | 5 |
| 60 | 2 | 0 | 0 | 6 |
| 61 | 0 | 1 | 0 | 6 |
| 62 | 1 | 1 | 1 | 6 |
| 63 | 2 | 1 | 1 | 0 |
| 64 | 0 | 2 | 1 | 0 |
| 65 | 1 | 2 | 2 | 0 |
| 66 | 2 | 2 | 2 | 1 |
| 67 | 0 | 0 | 2 | 1 |
| 68 | 1 | 0 | 3 | 1 |
| 69 | 2 | 0 | 3 | 2 |
| 70 | 0 | 1 | 3 | 2 |
| 71 | 1 | 1 | 4 | 2 |
| 72 | 2 | 1 | 4 | 3 |
| 73 | 0 | 2 | 4 | 3 |
| 74 | 1 | 2 | 0 | 3 |
| 75 | 2 | 2 | 0 | 4 |
| 76 | 0 | 0 | 0 | 4 |
| 77 | 1 | 0 | 1 | 4 |
| 78 | 2 | 0 | 1 | 5 |
| 79 | 0 | 1 | 1 | 5 |
| 80 | 1 | 1 | 2 | 5 |
| 81 | 2 | 1 | 2 | 6 |
| 82 | 0 | 2 | 2 | 6 |
| 83 | 1 | 2 | 3 | 6 |
| 84 | 2 | 2 | 3 | 0 |
| 85 | 0 | 0 | 3 | 0 |
| 86 | 1 | 0 | 4 | 0 |
| 87 | 2 | 0 | 4 | 1 |
| 88 | 0 | 1 | 4 | 1 |
| 89 | 1 | 1 | 0 | 1 |
| 90 | 2 | 1 | 0 | 2 |
| 91 | 0 | 2 | 0 | 2 |
| 92 | 1 | 2 | 1 | 2 |
| 93 | 2 | 2 | 1 | 3 |
| 94 | 0 | 0 | 1 | 3 |
| 95 | 1 | 0 | 2 | 3 |
| 96 | 2 | 0 | 2 | 4 |
| 97 | 0 | 1 | 2 | 4 |
| 98 | 1 | 1 | 3 | 4 |
| 99 | 2 | 1 | 3 | 5 |
| 100 | 0 | 2 | 3 | 5 |
| 101 | 1 | 2 | 4 | 5 |
| 102 | 2 | 2 | 4 | 6 |
| 103 | 0 | 0 | 4 | 6 |
| 104 | 1 | 0 | 0 | 6 |

The value of the counter is obtained due to function 36. For example, to find value C=19 (1, 1, 6): C32 is 1, and one can have C=1, 2, 3, 10, 11, 12, 19, 20, 21, etc. (counter 32 only changes one time out of three). C33 is 1, so one can thus also have C=2, 3, 4, 17, 18, 19, etc. (each series of three is separated by 15 (3*5)). C34 is 6, so one can thus also have C=18, 19, 20, 39, 40, 41, 60, 61, 62, etc. (each series of three is separated by 21 (3*7)). The smallest value common to the three counters is 19. A generalization of this operation to all counter values can be deduced from the Chinese reminder theorem (CRT).

A counter 127 normally requires seven bits. Here, with eight bits, this count is performed, but by dividing by three the maximum number of write operations supported by a bit.

The example of FIG. 2 and of table 1 is a simplified example illustrating the operation of a counter. In practice, the number of transactions counted by the counter is much greater. The implementation of the described counter essentially is advantageous to form a transaction counter counting beyond the number of write cycles that the non-volatile memory element can stand. As indicated, an EEPROM-type memory area generally supports several hundred thousand cycles (typically on the order of 500,000).

For example, a counter can be formed by using three non-volatile memory bytes having an endurance on the order of 1.5 million cycles (assuming that each byte stands 500,000 write cycles). Three sub-counters counting modulo 123, 127, and 128 will then for example be used. The maximum counter value then is 1,511,426 and there remains, in the structure, three bits capable of being used for a CRC.

According to another embodiment, a counter may be formed by using five non-volatile memory bytes to count to 2,564,323 even though the memory elements can only stand 500,000 write cycles per byte. According to this example, the sub-counters respectively count modulo 11, 27, 29, 31, and 32 and there remains, in the structure, seven bits available for a CRC calculation.

The provided structure enables, by only using six non-volatile memory bytes, forming transaction counters reaching counts of approximately three million. With a conventional structure, and assuming that each storage element can only stand 500,000 write cycles, eighteen bytes would be necessary (since each group of 3 bytes can only be used up to 500,000).

The respective modulo of the sub-counters are less than the values which can be reached by the sub-counters. Furthermore, the modulo are preferably not identical and the modulo of the sub-counters are different from each other for a given counter.

The utilization of the content of the sub-counters requires a decoding enabling to reconstruct the result. This decoding amounts to applying the following line of argument.

The number of sub-counters is called K (each of the sub-counters will generally be made in the form of one or two non-volatile memory bytes) and a single sub-counter is modified for each counter increment. Each sub-counter is identified by an index i (with i ranging between 1 and K). Note Mi the modulos used to cyclically shift the K sub-counters in the non-volatile memory. Note Pi the product of the modulos (Pi=ΠMj for j ranging between 1 and i). Note Ni (with i ranging between 1 and K) the values contained in the different sub-counters i. Noting C the counter value to be reconstructed, one should determine which of the counters has been incremented last to be able to obtain this value.

The reconstruction calculation is actually carried out for each possibility, that is, by successively considering that one i of the sub-counters has been incremented last.

Assuming that counter N1 is the last one to have been written into, C modK=1, since counters Ni are successively updated, with an increasing i. Each counter Ni has thus been incremented (C−1)/K times, except for counter N1, which has been incremented once more. At count C−1, each counter value Ni is C−1/K modMi since each Ni is incremented once out of K, and follows a cycle modulo Mi. By successively solving modular equations (by applying the to Chinese remainder theory), values C−1/K are obtained, from which value is C deduced, still assuming that counter N1 is the last one to have been written into.

The same calculation is performed, assuming that the other sub-counters have been written into last. Eventually, the smallest value provides the counter value.

The maximum value capable of being counted by the counter could theoretically be equal to the product of the modulos. However, in practice, one may in certain cases come across configurations of sub-counter values which have already appeared before the occurrence of this theoretical maximum. For example, this always occurs when one of the cells is incremented and cycles to 0 and one of the K first configurations is encountered again. This limit simply is the maximum count beyond which two possible values of the counter can no longer be distinguished. However, mechanically, the counter is still operative.

For example, for K=4 and assuming that the initial value of the K cells is 0 for a 0 counter, when the counter cycles to zero and one of the K first configurations reappears, that is:

$$\begin{matrix} 0 & 0 & 0 & 0 \\ 1 & 0 & 0 & 0 \\ 1 & 1 & 0 & 0 \\ 1 & 1 & 1 & 0, \end{matrix}$$

this means that the original configuration was one of the following:

$$\begin{matrix} M1-1 & 0 & 0 & 0 \\ 0 & M2-1 & 0 & 0 \\ 0 & 0 & M3-1 & 0 \\ 0 & 0 & 0 & M4-1 \\ 1 & M2-1 & 0 & 0 \\ 1 & 0 & M3-1 & 0 \\ 1 & 0 & 0 & M4-1 \\ 1 & 1 & M3-1 & 0 \\ 1 & 1 & 0 & M4-1 \\ 0 & 0 & 0 & M4-1. \end{matrix}$$

With the above indications, the value of the general counter can be reconstructed in all these configurations. The smallest of the values calculated hereabove provides the maximum usable value of the counter.

Various embodiments have been described, various alterations and modifications will occur to those skilled in the art. In particular, the practical implementation of the counter and the determination of the sizes of the non-volatile memory areas and of the modulos used depend on the application and are within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method, comprising:
incrementing or decrementing a single one of at least two sub-counters of a non-volatile memory on each new counting operation; and incrementing or decrementing successive ones of the at least two sub-counters on successive counting operations.

2. The method of claim 1 wherein each of the at least two sub-counters counts with a different modulo.

3. The method of claim 2, further comprising combining contents of the sub-counters to reconstruct a count.

4. The method of claim 3, wherein the combining is based on the Chinese remainder theorem.

5. The method of claim 3 wherein incrementing or decrementing is performed in a write mode of the non-volatile memory and combining is performed in a read mode of the non-volatile memory.

6. The method of claim 1 wherein each of the sub-counters comprises at least one byte of the non-volatile memory.

7. A method, comprising:
 counting with at least two sub-counters in a non-volatile memory;
 selecting a single one of the at least two sub-counters to be incremented or decremented by each new counting operation; and
 selecting successive ones of the sub-counters to be incremented or decremented by successive counting operations.

8. The method of claim 7 wherein each of the at least two sub-counters counts with a different modulo.

9. The method of claim 8, comprising reconstructing a count based on contents of the sub-counters.

10. The method of claim 9 wherein the reconstructing is based on the Chinese remainder theorem.

11. The method of claim 7 wherein each of the sub-counters comprises at least one byte of the non-volatile memory.

12. The method of claim 9 wherein one of the sub-counters is incremented or decremented in a write mode of the non-volatile memory and the count is reconstructed in a read mode of the non-volatile memory.

13. A method, comprising:
 counting with at least two sub-counters in a non-volatile memory, each of the sub-counters counting with a different modulo from the other sub-counters, wherein a single one of the sub-counters is incremented or decremented on each new counting operation and successive ones of the sub-counters are incremented or decremented on successive counting operations; and
 reconstructing a count from contents of the sub-counters.

14. The method of claim 13 wherein reconstructing the count is based on the Chinese remainder theorem.

15. The method of claim 13 wherein counting is performed in a write mode of the non-volatile memory and reconstructing is performed in a read mode of the non-volatile memory.

\* \* \* \* \*